US008749034B2

(12) United States Patent
Cho et al.

(10) Patent No.: US 8,749,034 B2
(45) Date of Patent: *Jun. 10, 2014

(54) HIGH POWER SEMICONDUCTOR PACKAGE WITH CONDUCTIVE CLIP AND FLIP CHIP DRIVER IC WITH INTEGRATED CONTROL TRANSISTOR

(75) Inventors: Eung San Cho, Torrance, CA (US); Chuan Cheah, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 290 days.

This patent is subject to a terminal disclaimer.

(21) Appl. No.: 13/095,725

(22) Filed: Apr. 27, 2011

(65) Prior Publication Data

US 2012/0168926 A1 Jul. 5, 2012

Related U.S. Application Data

(60) Provisional application No. 61/460,553, filed on Jan. 3, 2011.

(51) Int. Cl.
*H01L 23/495* (2006.01)
*H01L 23/52* (2006.01)
*H01L 23/34* (2006.01)
*H01L 23/48* (2006.01)
*H01L 29/40* (2006.01)

(52) U.S. Cl.
USPC .......... 257/676; 257/691; 257/723; 257/778; 257/784; 257/E23.079

(58) Field of Classification Search
USPC .......... 257/676, 687, 691, E23.031, E23.079, 257/723, 737, 738, 778, 779, 784, E23.01
See application file for complete search history.

(56) References Cited

U.S. PATENT DOCUMENTS

| | | | |
|---|---|---|---|
| 7,071,550 B2 * | 7/2006 | Sato | 257/706 |
| 7,271,470 B1 | 9/2007 | Otremba | |
| 7,372,146 B2 * | 5/2008 | Sato | 257/706 |
| 7,514,783 B2 * | 4/2009 | Shimokawa et al. | 257/706 |
| 8,062,932 B2 * | 11/2011 | Hebert et al. | 438/121 |
| 8,664,754 B2 | 3/2014 | Cho | |
| 2005/0161785 A1 | 7/2005 | Kawashima | |
| 2005/0167849 A1 * | 8/2005 | Sato | 257/778 |
| 2006/0044772 A1 * | 3/2006 | Miura | 361/767 |
| 2006/0055432 A1 * | 3/2006 | Shimokawa et al. | 327/5 |
| 2006/0097380 A1 * | 5/2006 | Sato | 257/706 |
| 2006/0113664 A1 * | 6/2006 | Shiraishi et al. | 257/723 |
| 2007/0249092 A1 * | 10/2007 | Joshi et al. | 438/107 |
| 2007/0257376 A1 * | 11/2007 | Shimokawa et al. | 257/778 |
| 2008/0122418 A1 * | 5/2008 | Briere et al. | 323/282 |

(Continued)

*Primary Examiner* — Teresa M Arroyo
(74) *Attorney, Agent, or Firm* — Farjami & Farjami LLP

(57) ABSTRACT

One exemplary disclosed embodiment comprises a high power semiconductor package configured as a buck converter having a sync transistor with a top surface having a drain, a flip chip driver integrated circuit (IC) having an integrated control transistor, the flip chip driver IC driving the sync and control transistors, and a conductive clip electrically coupling the drain of the sync transistor to a common portion of the leadframe shared with a control source of the control transistor. In this manner, the leadframe and the conductive clip provide efficient current conduction by direct mechanical connection and large surface area conduction, significantly reducing package electrical resistance, form factor, complexity, and cost compared to conventional packages. Moreover, by integrating only the control transistor rather than both the control and sync transistor within the flip chip driver IC, the sync transistor may remain separate, simplifying manufacture and providing greater total surface area for thermal dissipation.

16 Claims, 3 Drawing Sheets

(56) References Cited

U.S. PATENT DOCUMENTS

| | | | |
|---|---|---|---|
| 2009/0057869 A1* | 3/2009 | Hebert et al. | 257/691 |
| 2009/0072368 A1* | 3/2009 | Hu et al. | 257/676 |
| 2009/0121330 A1 | 5/2009 | Cruz | |
| 2009/0174044 A1* | 7/2009 | Eom et al. | 257/675 |
| 2009/0218683 A1* | 9/2009 | Satou et al. | 257/723 |
| 2012/0139130 A1* | 6/2012 | Satou et al. | 257/784 |
| 2012/0146211 A1* | 6/2012 | Shiraishi et al. | 257/723 |
| 2012/0168922 A1* | 7/2012 | Cho et al. | 257/676 |
| 2012/0168923 A1* | 7/2012 | Cho et al. | 257/676 |
| 2012/0168925 A1* | 7/2012 | Cho et al. | 257/676 |

* cited by examiner

US 8,749,034 B2

HIGH POWER SEMICONDUCTOR PACKAGE WITH CONDUCTIVE CLIP AND FLIP CHIP DRIVER IC WITH INTEGRATED CONTROL TRANSISTOR

BACKGROUND OF THE INVENTION

The present application claims the benefit of and priority to a pending provisional application entitled "Metal Clip for Efficient, Low Cost Package with Improved Current Carrying Capability and Reduced Form Factor and with Application in Buck Converters," Ser. No. 61/460,553 filed on Jan. 3, 2011. The disclosure in that pending provisional application is hereby incorporated fully by reference into the present application. Additionally, pending applications Ser. No. 11/986,848, filed on Nov. 27, 2007, titled "Synchronous DC/DC Converter," and Ser. No. 12/928,102, filed on Dec. 3, 2010, titled "DC/DC Converter with Depletion-Mode III-Nitride Switches," are also incorporated fully by reference into the present application.

DEFINITION

In the present application, "III-nitride" (or "III-Nitride") refers to a compound semiconductor that includes nitrogen and at least one group III element, such as, but not limited to, GaN, AlGaN, InN, AlN, InGaN, InAlGaN and the like.

FIELD OF THE INVENTION

The present invention relates generally to semiconductor devices. More particularly, the present invention relates to packaging of semiconductor devices.

BACKGROUND ART

For optimization of form factor, performance, and manufacturing cost, it is often desirable to integrate the components of a power circuit, such as a half-bridge based DC-DC converter or buck converter, into a single compact package. Thus, several package designs, including quad flat no leads (QFN) packages, have been developed to integrate several transistors within a single compact package. To provide sufficient electrical performance for the reliable operation of high power semiconductor packages, it is crucial to ensure high current carrying capacity and low resistance between transistors within the package.

Unfortunately, conventional high power semiconductor package designs use wirebonds for transistor interconnections, undesirably increasing electrical resistance while reducing current carrying capacity. Additionally, by following conventional package design rules to successfully accommodate such wirebonds, package form factor and complexity may undesirably increase. For example, package height may be increased to provide sufficient wirebond loop height, lateral package size may be increased to avoid wire crossing and the potential for wire shorting, and additional area on the package may be reserved for bond pad connections, thereby undesirably reducing package power density. Additionally, the increased package complexity resulting from the wirebonds may negatively affect manufacturing time, cost, and package yields.

Thus, a unique and cost-effective solution is needed to support the efficient design and operation of high power semiconductor packages integrating multiple transistors, such as buck converters.

SUMMARY OF THE INVENTION

A high power semiconductor package with conductive clip and flip chip driver IC with integrated control transistor, substantially as shown in and/or described in connection with at least one of the figures, and as set forth more completely in the claims.

DETAILED DESCRIPTION OF THE INVENTION

The present application is directed to a high power semiconductor package with conductive clip and a flip chip driver IC with integrated control transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
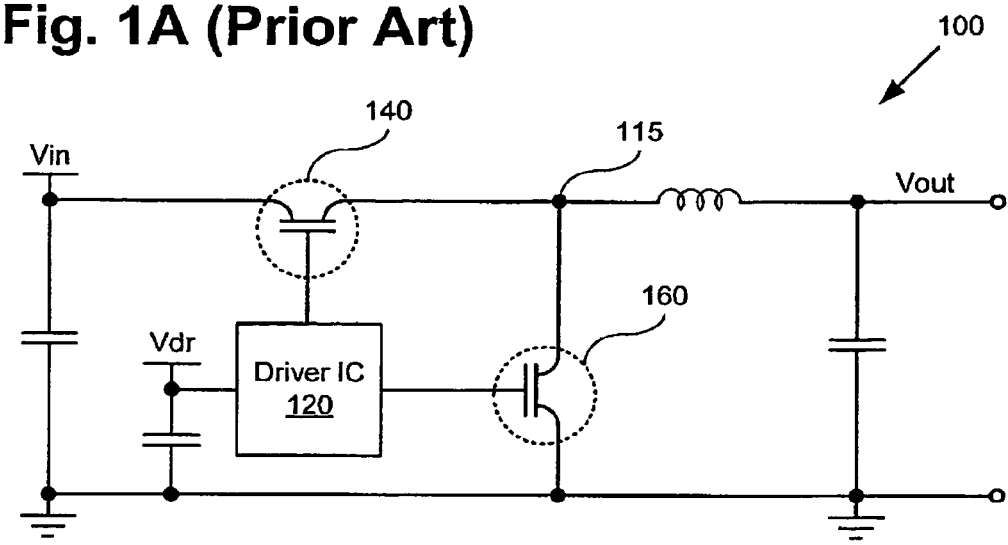
FIG. 1A illustrates a circuit diagram of a buck converter using a half-bridge topology.

FIG. 1A illustrates a circuit diagram of a buck converter using a half-bridge topology. Diagram 100 includes switched node 115, driver integrated circuit (IC) 120, control transistor 140 (also referred to as a "control switch" or a "control FET"), and synchronous transistor 160 (also referred to as a "synchronous switch," a "sync switch," a "synchronous FET," or a "sync FET"). The source of control transistor 140 is coupled to the drain of sync transistor 160 at switched node 115. Driver IC 120 operates on voltage Vdr and controls the duty cycles of control transistor 140 and sync transistor 160, thereby converting the input voltage Vin to a specific output voltage Vout. Control transistor 140 and sync transistor 160 may each comprise a conventional field effect transistor (FET) switch, for example a silicon FET. However, control transistor 140 and sync transistor 160 may each also comprise a non-silicon FET or any other FET in general. Alternatively, one or both of control transistor 140 and sync transistor 160 may also comprise a III-nitride transistor.

Figure 1B:
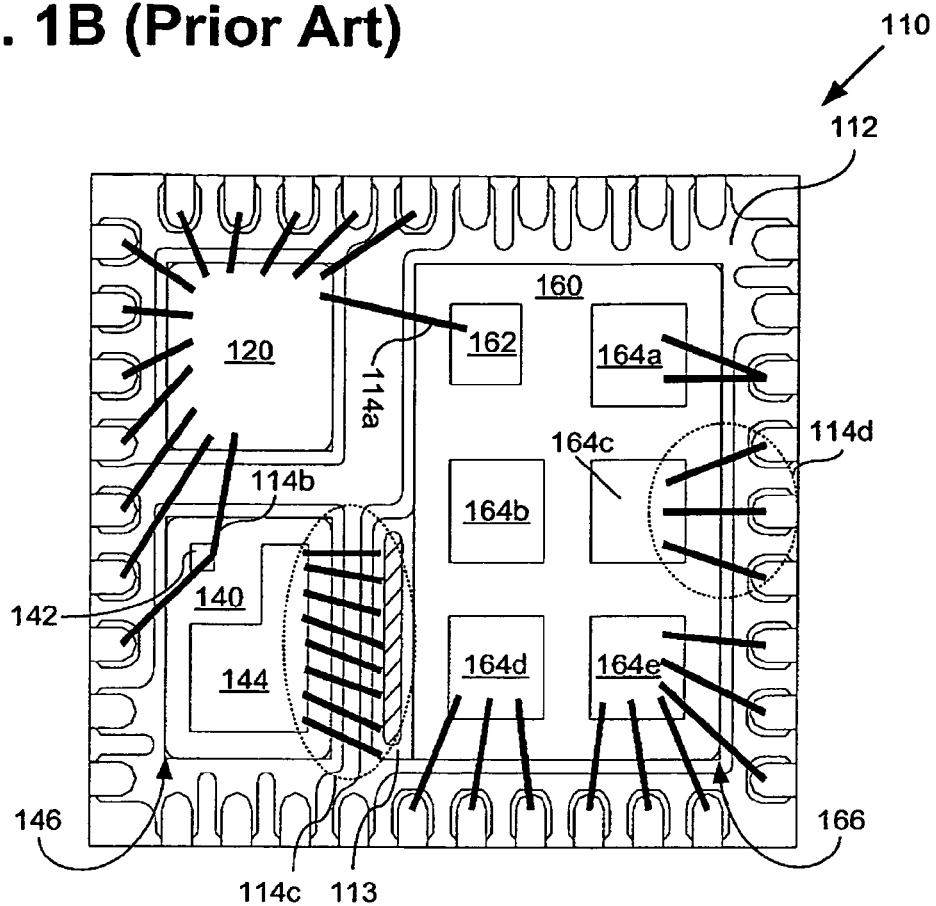
FIG. 1B illustrates a top view of a conventional high power semiconductor package.

As discussed above, it may be desirable to implement the circuit of diagram 100 of FIG. 1A in a compact and integrated package, such as a QFN package. Accordingly, turning to FIG. 1B, FIG. 1B illustrates a top view of a conventional high power semiconductor package. Package 110 of FIG. 1B includes leadframe 112, leadframe paddle 113, wirebonds 114a, 114b, 114c, and 114d, driver IC 120, control transistor 140, and sync transistor 160. Package 110 may comprise, for example, a QFN package. Control transistor 140 includes a top surface having a control gate 142 and a control source 144. Control transistor 140 also includes a bottom surface having a control drain 146, hidden from view in FIG. 1B. Sync transistor 160 includes a top surface having a sync gate 162 and a sync source comprised of sync source pads 164a, 164b, 164c, 164d, and 164e. Sync transistor 160 also includes a bottom surface having a sync drain 166, hidden from view in FIG. 1B.

The sync source of sync transistor 160 is electrically coupled to leadframe 112 by several wirebonds connected to various sync source pads such as, for example, wirebonds 114d connected to sync source pad 164c. Driver IC 120 is connected to several sections of leadframe 112 for input/output. Driver IC 120 is also electrically coupled to control gate 142 via wirebond 114b and sync gate 162 via wirebond 114a. Sync drain 166 is electrically coupled to leadframe paddle 113 of leadframe 112, and leadframe paddle 113 in turn is electrically coupled to control source 144 through wirebonds 114c. Similarly, control drain 146 may also be disposed on leadframe paddle 113, hidden from view in FIG. 1B. Leadframe paddle 113 may comprise an easily solderable metal such as aluminum, or other solderable materials such as a metal alloy or a tri-metal.

Thus, the layout of package 110 in FIG. 1B connects driver IC 120, control transistor 140, and sync transistor 160 as shown in diagram 100 of FIG. 1A. As previously noted, for high power semiconductor packages, it is particularly important to optimize the interconnections between transistors, such as at switched node 115 of FIG. 1A. However, the conventional package design shown in FIG. 1B requires the use of wirebonds 114c to connect control transistor 140 and sync transistor 160 at switched node 115 of FIG. 1A. Moreover, the current input/output path for sync source pads 164a through 164e must travel through restrictive wirebonds as well, such as wirebonds 114d. The wirebonds of package 110 in FIG. 1B thus disadvantageously increase package electrical resistance, form factor, complexity, and cost.

Figure 2A:
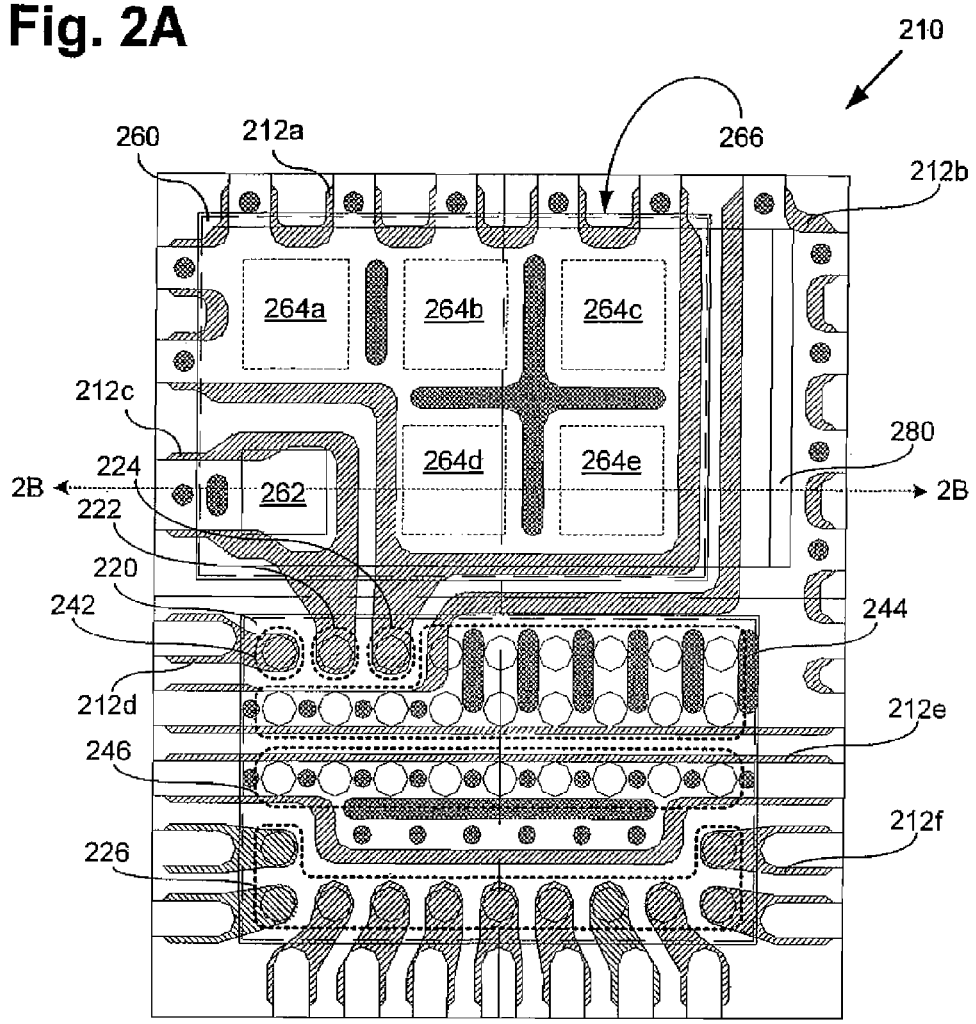
FIG. 2A illustrates a top view of a high power semiconductor package with a conductive clip and a flip chip driver IC having an integrated control transistor according to an embodiment of the invention.

Moving to FIG. 2A, FIG. 2A illustrates a top view of a high power semiconductor package with a conductive clip and a flip chip driver IC with an integrated control transistor according to an embodiment of the invention. Package 210 in FIG. 2A may comprise, for example, a leadless package such as a QFN package. Package 210 includes leadframe pads 212a, 212b, 212c, 212d, 212e, and 212f, flip chip driver IC 220, sync transistor 260, and conductive clip 280. As shown in FIG. 2A, flip chip driver IC 220 is configured as a flip chip and may include several input and output connections within region 226. Flip chip driver IC 220 also integrates a control transistor having a control gate 242, control source 244, and control drain 246. Flip chip driver IC 220 may optionally include connection 224 for current monitoring. Sync transistor 260 includes a top surface having a sync drain 266. Sync transistor 260 also includes a bottom surface having a sync gate 262 and a sync source comprised of sync source pads 264a, 264b, 264c, 264d, and 264e. Sync gate 262 is also electrically coupled to connection 224 of flip chip driver IC 220 through leadframe pad 212c. Sync gate 262 and sync source pads 264a through 264e are further arranged into a grid. However, alternative embodiments may use other pad arrangements, such as an L-shaped sync source pad. As shown in diagram 200 of FIG. 2A, package 210 may omit wirebonds since driver IC 220 is a flip chip. Significantly, it is noted that sync transistor 260 is reversed in orientation (sync transistor 260 has drain on top, with source and gate on bottom) in relation to sync transistor 160 of FIG. 1B (sync transistor 160 has source and gate on top, with drain on bottom). It is also noted that since driver IC 220 is configured as a flip chip and includes an integrated control transistor, control gate 242, control source 244, and control drain 246 are all on bottom, whereas control transistor 140 of FIG. 1B has source and gate on top, with drain on bottom. It is noted that in various embodiments of the present invention, the integrated control transistor of flip chip driver IC 220 and/or sync transistor 260 can be depletion mode transistors, for example, III-nitride depletion mode transistors.

Figure 2B:
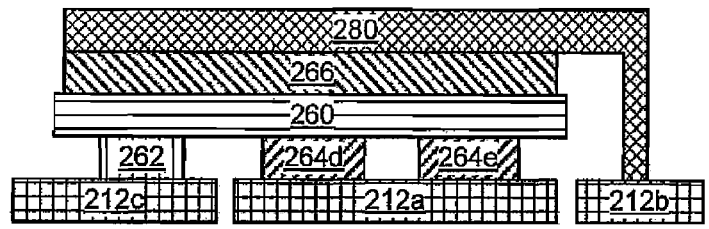
FIG. 2B illustrates a cross sectional view of a portion of a high power semiconductor package according to an embodiment of the invention.

For purposes of clarity, an encapsulating mold compound or a hermetic seal is omitted from FIGS. 2A and 2B, but may be included in package 210. Furthermore, with respect to FIG. 2A, flip chip driver IC 220 may correspond to a combined driver IC 120 and control transistor 140 from FIG. 1A, and sync transistor 260 may correspond to sync transistor 160 from FIG. 1A.

As shown in FIGS. 2A and 2B, conductive clip 280 electrically couples sync drain 266 to leadframe pad 212b. Since control source 244 is disposed on leadframe pad 212b, sync drain 266 and control source 244 are electrically coupled through leadframe pad 212b. Thus, sync drain 266 is more efficiently connected to control source 244 through the direct mechanical connection and large surface area conduction of conductive clip 280 and leadframe pad 212b in FIG. 2A (as also shown in FIG. 2B), rather than through the restrictive wirebonds 114c in FIG. 1B. Further, as shown in FIGS. 2A and 2B, ground connection to sync source pads, such as sync source pads 264d and 264e, is provided through leadframe pad 212a rather than restrictive wirebonds, such as wirebonds 114d in FIG. 1B, resulting in lower resistance, lower inductance, and more reliable and more direct mechanical and electrical connection between the sync source and ground.

Conductive clip 280 may comprise a metal such as copper, a metal alloy, or another highly conductive material. Conductive clip 280 may be attached to sync drain 266 and leadframe pad 212b using solder, conductive adhesive, or another attachment means. Thus, effective current conduction paths are also provided to and from external connections of the package.

Accordingly, package 210 of FIG. 2A may also implement the buck converter of FIG. 1A but with far greater package performance compared to package 110 of FIG. 1B. More specifically, leadframe pad 212b and conductive clip 280 provide a low resistance, high current path for the connection at switched node 115 of FIG. 1A when compared to wirebonds 114c of FIG. 1B, and conductive clip 280 also provides effective current conduction paths, thereby advantageously reducing package electrical resistance, form factor, complexity, and cost. Moreover, the use of a flip chip for driver IC 220 allows for the elimination of wirebonds, and the integration of only the control transistor rather than both the control and sync transistors into flip chip driver IC 220 allows sync transistor 260 to remain separate, simplifying manufacture and providing greater total surface area for enhanced thermal performance.

FIG. 2B illustrates a cross sectional view of a portion of a high power semiconductor package according to an embodiment of the invention. The portion shown in FIG. 2B corresponds to the cross sectional line indicated by line 2B-2B of FIG. 2A. FIG. 2B includes leadframe pads 212a, 212b and 212c, sync gate 262, sync source pads 264d and 264e, sync transistor 260, sync drain 266, and conductive clip 280. While only the semiconductor device body is indicated as sync transistor 260 for simplicity, it is to be understood that sync transistor 260 may also include any top and bottom surface electrodes such as sync drain 266, sync gate 262, and sync source pads 264*d* and 264*e*. FIG. 2B also makes more apparent the L-shape of conductive clip 280, which enables the electrical coupling of sync drain 266 to leadframe pad 212*b*. Comparing FIGS. 2B and 2A, it can be observed that conductive clip 280 electrically couples sync drain 266 and control source 244 through leadframe pad 212*b*.

According to the present invention, conductive clip 280 and leadframe pad 212*b* are used for the connection between the control source 244 and the sync drain 266. The larger surface area, shorter distance, and lower resistance connections provided by leadframe pad 212*b* and conductive clip 280 enable a package with reduced electrical resistance, form factor, complexity, and cost when compared to conventional packaging methods using wirebonds such as wirebonds 114*c* of FIG. 1B. Additionally, integrating only the control transistor rather than both the control and sync transistor within flip chip driver IC 220 allows sync transistor 260 to remain separate, simplifying manufacture and providing greater total surface area for thermal dissipation.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high power semiconductor package comprising:
    a sync transistor disposed on a leadframe and including a bottom surface having a sync source and a sync gate and a top surface having a sync drain;
    a flip chip disposed on said leadframe, said flip chip comprising:
        a control transistor including a control source and a control gate;
        a driver integrated circuit (IC) electrically coupled to said sync gate and said control gate, wherein said control transistor and said driver IC are integrated within said flip chip;
    a conductive clip electrically coupling said sync drain to said leadframe, said control source being electrically coupled to said sync drain by a common region of said leadframe.

2. The high power semiconductor package of claim 1, wherein electrical couplings for said sync transistor, said control transistor, and said driver IC do not include a wirebond.

3. The high power semiconductor package of claim 1, wherein said flip chip comprises a ball grid array (BGA) chip.

4. The high power semiconductor package of claim 1, wherein said sync source and said sync gate are arranged into a grid.

5. The high power semiconductor package of claim 1, wherein said conductive clip is attached to said sync drain by solder.

6. The high power semiconductor package of claim 1, wherein said conductive clip comprises a copper clip.

7. The high power semiconductor package of claim 1, wherein said sync transistor comprises a III-nitride depletion mode transistor.

8. The high power semiconductor package of claim 1, wherein said control transistor comprises a III-nitride depletion mode transistor.

9. A high power semiconductor package comprising:
    a sync transistor disposed on a leadframe and including a bottom surface having a sync source and a top surface having a sync drain;
    a flip chip disposed on said leadframe, said flip chip comprising:
        a control transistor including a control source;
        a driver integrated circuit (IC) driving said sync transistor and said control transistor, wherein said control transistor and said driver IC are integrated within said flip chip;
    a conductive clip electrically coupling said sync drain to said leadframe, said control source being electrically coupled to said sync drain by a common region of said leadframe.

10. The high power semiconductor package of claim 9, wherein electrical couplings for said sync transistor, said control transistor, and said driver IC do not include a wirebond.

11. The high power semiconductor package of claim 9, wherein said flip chip comprises a ball grid array (BGA) chip.

12. The high power semiconductor package of claim 9, wherein said sync transistor includes a sync gate arranged into a grid with said sync source on said bottom surface thereof.

13. The high power semiconductor package of claim 9, wherein said conductive clip is attached to said sync drain by solder.

14. The high power semiconductor package of claim 9, wherein said conductive clip comprises a copper clip.

15. The high power semiconductor package of claim 9, wherein said sync transistor comprises a III-nitride depletion mode transistor.

16. The high power semiconductor package of claim 9, wherein said control transistor comprises a III-nitride depletion mode transistor.

* * * * *